(12) United States Patent
Lee et al.

(10) Patent No.: US 10,692,949 B2
(45) Date of Patent: Jun. 23, 2020

(54) ELECTROLUMINESCENT DISPLAY DEVICE AND METHOD OF FABRICATING THE SAME

(71) Applicant: LG DISPLAY CO., LTD., Seoul (KR)

(72) Inventors: Sang-Bin Lee, Paju-si (KR); Jeong-Mook Choi, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/808,435

(22) Filed: Nov. 9, 2017

(65) Prior Publication Data

US 2018/0138255 A1 May 17, 2018

(30) Foreign Application Priority Data

Nov. 11, 2016 (KR) .......................... 10-2016-0150543
Sep. 27, 2017 (KR) .......................... 10-2017-0125401

(51) Int. Cl.
*H01L 27/32* (2006.01)
*H01L 51/00* (2006.01)
(Continued)

(52) U.S. Cl.
CPC ....... *H01L 27/3262* (2013.01); *G09G 3/3233* (2013.01); *H01L 27/3246* (2013.01);
(Continued)

(58) Field of Classification Search
CPC . H01L 27/32; H01L 27/3202; H01L 27/3204; H01L 27/3211; H01L 27/3223;
(Continued)

(56) References Cited

U.S. PATENT DOCUMENTS

| 8,816,339 B2 * | 8/2014 | Kawamura | H01L 27/3246 257/40 |
| 2009/0026467 A1 * | 1/2009 | Yanagihara | H01L 27/3246 257/88 |

(Continued)

FOREIGN PATENT DOCUMENTS

JP         2013-89293 A    5/2013

*Primary Examiner* — Natalia A Gondarenko
(74) *Attorney, Agent, or Firm* — Birch, Stewart, Kolasch & Birch, LLP

(57) ABSTRACT

An electroluminescent display device and method of fabricating the same are discussed. The electroluminescent display device includes a substrate including first to third pixel regions, the second and third pixel regions being adjacent to the first pixel region along a first direction and a second direction, respectively; an insulating layer over the substrate and including a groove between the first and second pixel regions; a first electrode on the insulating layer and in each of the first to third pixel regions; a bank covering an edge of the first electrode and disposed between the first pixel region and the second pixel region and between the first pixel region and the third pixel region; an emitting layer on the first electrode; and a second electrode on the emitting layer, wherein the bank disposed between the first and second pixel regions has a first height from the first electrode and the bank disposed between the first and third pixel regions has a second height from the first electrode, and the first height is smaller than the second height.

24 Claims, 12 Drawing Sheets

(51) Int. Cl.
*H01L 29/786* (2006.01)
*G09G 3/3233* (2016.01)

(52) U.S. Cl.
CPC .... *H01L 27/3258* (2013.01); *H01L 29/78603* (2013.01); *H01L 51/0005* (2013.01); *G09G 2300/0426* (2013.01); *G09G 2300/0439* (2013.01); *H01L 2251/558* (2013.01)

(58) Field of Classification Search
CPC ............. H01L 27/3225; H01L 27/3241; H01L 27/3262; H01L 27/3258; H01L 27/3246; H01L 27/3248; H01L 27/326; H01L 27/3283; H01L 27/3295; H01L 29/78603; H01L 2251/558; H01L 51/0005; H01L 51/105; H01L 51/107; H01L 51/448; H01L 51/50; H01L 51/52; H01L 51/5253; H01L 51/5256; H01L 51/5237; G09G 3/3233; G09G 2300/0439; G09G 2300/0426

USPC ......... 257/76, 40, 88, 72, E33.001, E33.065, 257/E51.018; 438/34, 99
See application file for complete search history.

(56) References Cited

U.S. PATENT DOCUMENTS

| | | | |
|---|---|---|---|
| 2011/0108859 A1* | 5/2011 | Oosako | H01L 27/3246 257/88 |
| 2013/0099221 A1 | 4/2013 | Kawamura et al. | |
| 2013/0277649 A1* | 10/2013 | Gregory | H01L 27/3246 257/40 |
| 2014/0147950 A1* | 5/2014 | Choi | H01L 51/0005 438/46 |
| 2014/0175469 A1 | 6/2014 | Dozen et al. | |
| 2016/0190213 A1* | 6/2016 | Kim | H01L 27/326 257/40 |

* cited by examiner

ELECTROLUMINESCENT DISPLAY DEVICE AND METHOD OF FABRICATING THE SAME

CROSS-REFERENCE TO RELATED APPLICATIONS

The present application claims the priority benefit of Korean Patent Application No. 10-2016-0150543 filed in the Republic of Korea on Nov. 11, 2016 and Korean Patent Application No. 10-2017-0125401 filed in the Republic of Korea on Sep. 27, 2017, all these applications are hereby incorporated by reference into the present application.

BACKGROUND

Field

The present disclosure relates to a display device, and more particularly, to an electroluminescent display device being capable of providing a uniform brightness and a high display quality and a method of fabricating the same.

Discussion of the Related Art

Recently, a flat panel display device having excellent characteristics of a thin profile, a light weight and low power consumption has been developed and used.

Among the flat panel display device, an electroluminescent display device may be formed on a flexible substrate such as a plastic substrate. In addition, since the electroluminescent display device is a self-emission type, the electroluminescent display device has excellent characteristics in contrast ratio, a viewing angle, a thin profile, a response time, a thermal stability, and so on. The electroluminescent display device may be referred to as a light emitting display device. The electroluminescent display device may include an anode as a hole injection electrode, a cathode as an electron injection electrode and an emitting layer between the anode and the cathode. The hole from the anode and the electron from the cathode are combined in the emitting layer to form an exciton, and the light is emitted from the emitting layer by a radiative recombination of the exciton.

FIG. 1 is a schematic view showing an energy band diagram of the related art electroluminescent display device.

As shown in FIG. 1, the electroluminescent display device includes an anode 1, a cathode 7 and an emitting material layer (EML) 4 between the anode 1 and the cathode 7. For the hole injection from the anode into the EML 4 and the electron injection from the cathode 7 into the EML 4, the electroluminescent display device may further include a hole transporting layer (HTL) 3 between the anode 1 and the EML 4 and an electron transporting layer (ETL) 5 between the cathode 7 and the EML 4. In addition, to further efficiently injecting the hole and the electron into the EML 4, the electroluminescent display device may further include a hole injection layer (HIL) 2 between the anode 1 and the HTL 3 and an electron injection layer (EIL) 6 between the cathode and the ETL 5.

In the electroluminescent display device, the hole "h+" provided from the anode 1 into the EML 4 through the HIL 2 and the HTL 3 and the electron "e−" provided from the cathode 7 into the EML 4 through the EIL 6 and the ETL 5 are combined to form an exciton, and the light having a color in correspondence to a band gap of the EML 4 is provided from the exciton.

For example, the EML 4, the HIL 2, the HTL 3, the ETL 5 and the EIL 6 may be formed by a vacuum thermal evaporation process using a fine metal mask.

However, the production cost of the electroluminescent display device is increased by the vacuum thermal evaporation process, and the application of the vacuum thermal evaporation process for the large size and high resolution electroluminescent display device is difficult because of a deviation problem of the mask, a deformation problem of the mask, a shadow effect in the mask, and so on.

To resolve the problems, the solution process for the emitting layer is introduced. In the solution process, a nozzle of an injection apparatus is scanned along a direction to drop an emitting material in a pixel region surrounding by a bank. The emitting material is dried to form the emitting layer.

However, the emitting layer formed by the solution process may have a non-uniform thickness. Namely, in a cross-section, the emitting layer may have a "U" shape or a "W" shape.

The electroluminescent display device, which includes the emitting layer having a non-uniform thickness, provides a non-uniform emission. Accordingly, in the electroluminescent display device, the brightness becomes non-uniform, and the display quality is degraded.

SUMMARY

Accordingly, the present invention is directed to an electroluminescent display device and a method of fabricating the same that substantially obviate one or more of the problems due to limitations and disadvantages of the related art.

An object of the present invention is to provide an electroluminescent device that has a uniform brightness and a high display quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an electroluminescent display device includes a substrate including first to third pixel regions, the second and third pixel regions being adjacent to the first pixel region along a first direction and a second direction, respectively; an insulating layer over the substrate and including a groove between the first and second pixel regions; a first electrode on the insulating layer and in each of the first to third pixel regions; a bank covering an edge of the first electrode and disposed between the first pixel region and the second pixel region and between the first pixel region and the third pixel region; an emitting layer on the first electrode; and a second electrode on the emitting layer, wherein the bank disposed between the first and second pixel regions has a first height from the first electrode and the bank disposed between the first and third pixel regions has a second height from the first electrode, and the first height is smaller than the second height.

In another aspect, an electroluminescent display device includes a substrate including first to third pixel regions, the second and third pixel regions being adjacent to the first pixel region along a first direction and a second direction, respectively; a first electrode in each of the first to third pixel regions; a bank covering an edge of the first electrode and disposed between the first pixel region and the second pixel region and between the first pixel region and the third pixel region; an emitting layer on the first electrode; and a second electrode on the emitting layer, wherein a portion of a bottom surface of the bank between the first pixel region and the second pixel region is disposed lower than a portion of a bottom surface of the bank between the first pixel region and the third pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments of the present invention, examples of which are illustrated in the accompanying drawings.

Figure 1:
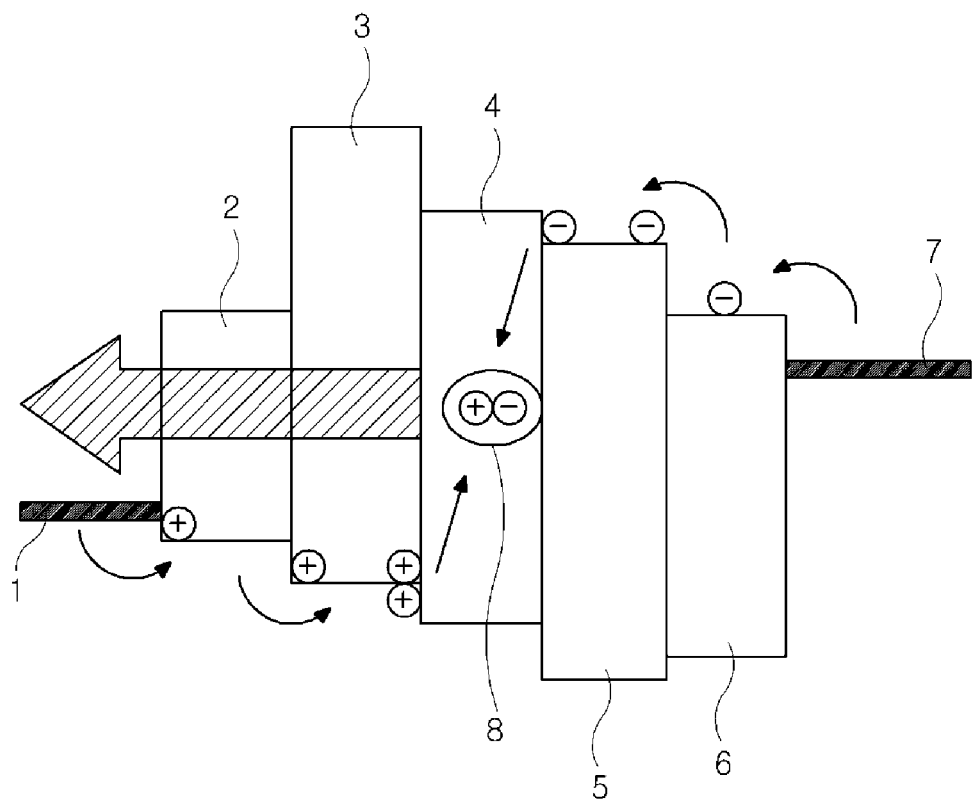
FIG. 1 is a schematic view showing an energy band diagram of the related art electroluminescent display device.
Figure 2:
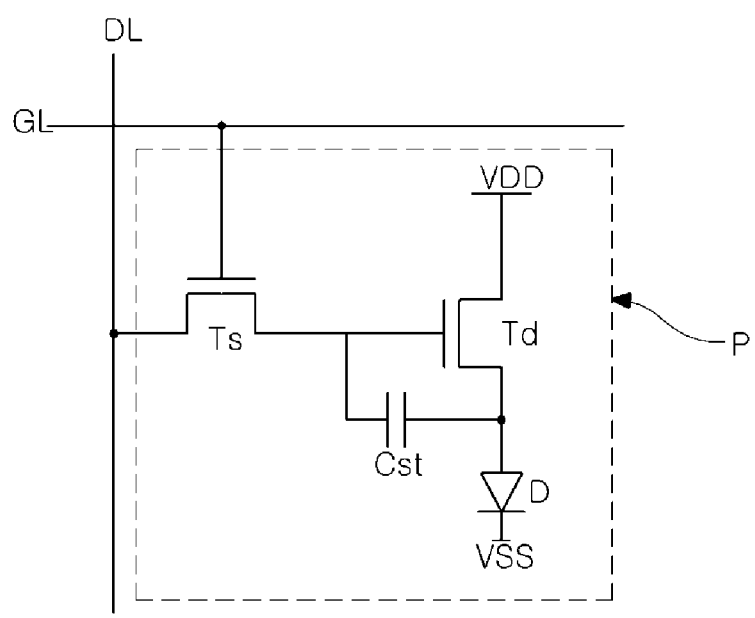
FIG. 2 is a schematic circuit diagram of an electroluminescent display device according to an embodiment of the present invention.

FIG. 2 is a schematic circuit diagram of an electroluminescent display device according to the present invention. All components of the electroluminescent display device according to all embodiments of the present invention are operatively coupled and configured.

As shown in FIG. 2, in the electroluminescent display device, a gate line GL and a data line DL are formed, and a pixel region P is defined by the gate and data lines GL and DL. In the pixel region P, a switching thin film transistor (TFT) Ts, a driving TFT Td, a storage capacitor Cst and a light emitting diode D are formed.

A gate electrode of the switching TFT Ts is connected to the gate line GL, and a source electrode of the switching TFT Ts is connected to the data line DL. A gate electrode of the driving TFT Td is connected to a drain electrode of the switching TFT Ts, and a source electrode of the driving TFT Td is connected to a high voltage supply VDD. An anode of the light emitting diode D is connected to a drain electrode of the driving TFT Td, and a cathode of the light emitting diode D is connected to a low voltage supply VSS. The storage capacitor Cst is connected to a gate electrode and the drain electrode of the driving TFT Td.

In the electroluminescent display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the light emitting diode D from the high voltage supply VDD through the driving TFT Td. As a result, the light emitting diode D emits light. Since the current in the light emitting diode D is proportional to the data signal and the light intensity emitted from the light emitting diode D is proportional to the current in the light emitting diode D, the pixel region P provide a gray scale according to the data signal.

The storage capacitor Cst serves to maintain the voltage of the gate electrode of the driving TFT Td for one frame. Accordingly, the electroluminescent display device displays images.

Figure 3:
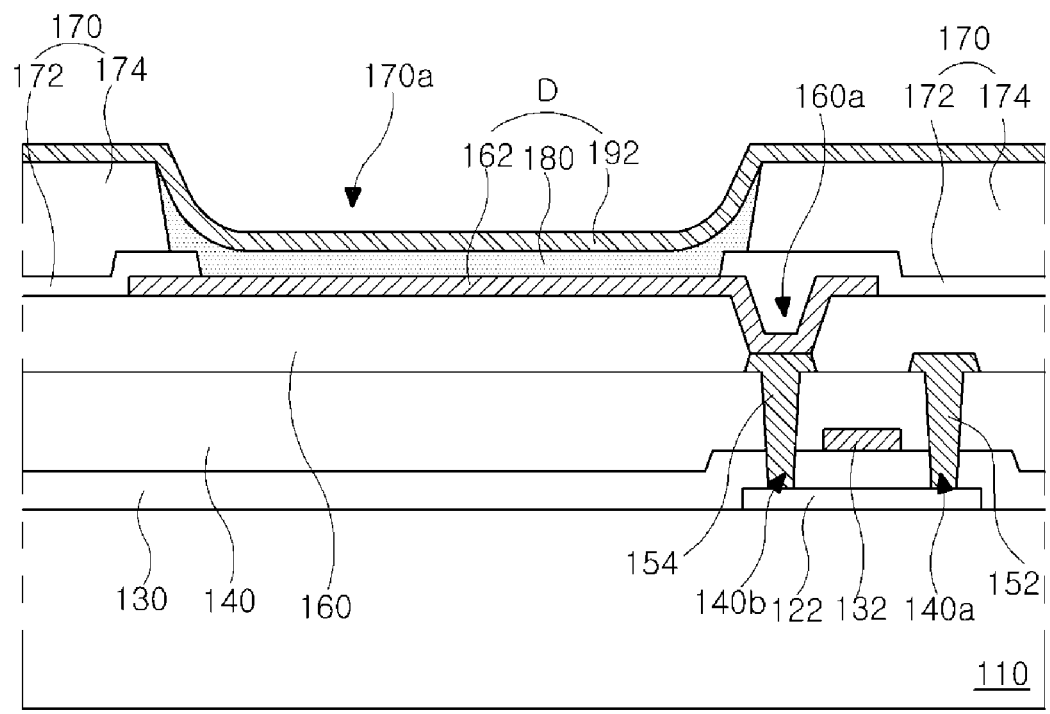
FIG. 3 is a schematic cross-sectional view of an electroluminescent display device according to an embodiment of the present invention.

FIG. 3 is a schematic cross-sectional view of an electroluminescent display device according to the present invention.

As shown in FIG. 3, a semiconductor layer 122 is formed on an insulating substrate 110. The substrate 110 may be a glass substrate or a flexible substrate of a polymer. For example, the substrate 110 may be a polyimide substrate.

The semiconductor layer 122 may be formed of an oxide semiconductor material or a poly-silicon. When the semiconductor layer 122 includes the oxide semiconductor material, a light-shielding pattern may be formed under the semiconductor layer 122. The light radiated to the semiconductor layer 122 is shielded or blocked by the light-shielding pattern such that thermal degradation of the semiconductor layer 122 can be prevented. On the other hand, when the semiconductor layer 122 includes polycrystalline silicon, a buffer layer may be formed between the substrate 110 and the semiconductor layer 122. In addition, impurities may be doped into both sides of the semiconductor layer 122 of polycrystalline silicon.

A gate insulating layer 130 is formed on the semiconductor layer 122. The gate insulating layer 130 may be formed of an inorganic insulating material such as silicon oxide or silicon nitride.

A gate electrode 132, which is formed of a conductive material, e.g., metal, is formed on the gate insulating layer 130 to correspond to a center of the semiconductor layer 122. In addition, the gate line and a first capacitor electrode may be formed on the gate insulating layer 130. The gate line extends along a direction, and the first capacitor electrode is connected to the gate electrode 132.

In FIG. 3, the gate insulating layer 130 is formed on the entire surface of the substrate 110. Alternatively, the gate insulating layer 130 may be patterned to have the same shape as the gate electrode 132.

An interlayer insulating layer 140, which is formed of an insulating material, is formed on an entire surface of the substrate 110 including the gate electrode 132. The interlayer insulating layer 140 may be formed of an inorganic insulating material, e.g., silicon oxide or silicon nitride, or an organic insulating material, e.g., benzocyclobutene or photo-acryl.

The interlayer insulating layer 140 includes first and second contact holes 140a and 140b exposing both sides of the semiconductor layer 122. The first and second contact holes 140a and 140b are positioned at both sides of the gate electrode 132 to be spaced apart from the gate electrode 132.

In FIG. 3, the first and second contact holes 140a and 140b are formed in the gate insulating layer 130 and the interlayer insulating layer 140. Alternatively, when the gate insulating layer 130 is patterned to have the same shape as the gate electrode 132, the first and second contact holes 140a and 140b are formed in the interlayer insulating layer 140.

A source electrode 152 and a drain electrode 154, which are formed of a conductive material, e.g., metal, are formed on the interlayer insulating layer 140. In addition, the data line, a power line and a second capacitor electrode may be formed on the interlayer insulating layer 140. The data line extends along a direction, which may be perpendicular to the direction of the gate line. The gate and data lines cross each other to define a pixel region. The power line providing the high voltage may be parallel to and spaced apart from the data line. The second capacitor electrode is connected to the drain electrode 154 and overlaps the first capacitor electrode to form the storage capacitor with the interlayer insulating layer 140 as a dielectric layer.

The source electrode 152 and the drain electrode 154 are spaced apart from each other with respect to the gate electrode 132 and respectively contact both sides of the semiconductor layer 122 through the first and second contact holes 140a and 140b.

The semiconductor layer 122, the gate electrode 132, the source electrode 152 and the drain electrode 154 constitute a TFT.

The gate electrode 132, the source electrode 152 and the drain electrode 154 are positioned over the semiconductor layer 122. Namely, the TFT has a coplanar structure.

Alternatively, in the TFT, the gate electrode may be positioned under the semiconductor layer, and the source and drain electrodes may be positioned over the semiconductor layer such that the TFT may have an inverted staggered structure. In this instance, the semiconductor layer may include amorphous silicon.

The TFT serves as the driving TFT, and the switching TFT, which may have substantially same structure as the driving TFT, is further formed on the substrate 110. The gate electrode 132 of the driving TFT is connected to the drain electrode of the switching TFT, and the source electrode 152 of the driving TFT is connected to the power line. The gate electrode and the source electrode of the switching TFT are connected to the gate line and the data line, respectively.

A passivation layer 160 of an insulating material is formed over an entire surface of the substrate 110 to cover the source and drain electrodes 152 and 154. The passivation layer 160 may be formed of an organic insulating material, e.g., benzocyclobutene or photo-acryl. An inorganic insulating layer, which is formed of an inorganic material such as silicon oxide or silicon nitride, may be formed under the passivation layer 160.

The passivation layer 160 includes a drain contact hole 160a exposing the drain electrode 154. The drain contact hole 160a is positioned directly over the second contact hole 140b. Alternatively, the drain contact hole 160a may be spaced apart from the second contact hole 140b.

A first electrode 162, which is connected to the drain electrode 154 through the drain contact hole 160a, is separately formed on the passivation layer 160 in each pixel region. The first electrode 162 may be an anode and may be formed of a conductive material having a relatively high work function. For example, the first electrode 162 may be formed of a transparent conductive material such as indium-tin-oxide (ITO) or indium-zinc-oxide (IZO).

A bank 170, which covers edges of the first electrode 162, is formed on the passivation layer 160. The bank 170 is formed of an insulating material. The bank 170 is positioned between adjacent pixel regions and includes a transmitting hole 170a exposing a center of the first electrode 162 in the pixel region.

The bank 170 includes a first bank 172 and a second bank 174 on the first bank 172. A width of the first bank 172 is greater than that of the second bank 174. The first bank 172 includes a material having a relatively high surface energy such that a contact angle of an emitting material to the first bank 172 is reduced. The second bank 174 includes a material having a relatively low surface energy such that a contact angle of an emitting material to the second bank 174 is increased such that an overflow of the emitting material into adjacent pixel region is prevented. For example, the first bank 172 may be formed of an inorganic material or an organic material each having a hydrophilic property, and the second bank 174 may be formed of an organic material having a hydrophobic property.

Alternatively, the first bank 172 and the second bank 174 may be formed of the same material. In this instance, each of the first and second banks 172 and 174 may be formed of an organic material having a hydrophobic property. In addition, the bank 170 may have a single-layered structure of an organic material having a hydrophobic property.

An emitting layer 180 is formed on the first electrode 162. Namely, the emitting layer 180 contacts the first electrode 162 in the transmitting hole 170a. The emitting layer 180 may be formed by a solution process. For example, the emitting layer 180 may be formed by a printing process or a coating process using an injection apparatus having a plurality of nozzles, but it is not limited thereto. An inkjet printing process may be used.

Further, the emitting layer 180 may include a hole auxiliary layer, an EML and an electron auxiliary layer sequentially stacked on the first electrode 162. For example, the hole auxiliary layer may include at least one of the HIL and the HTL, and the electron auxiliary layer may include at least one of the ETL and the EIL.

In this instance, the hole auxiliary layer and the EML may be formed in the transmitting hole 170a, and the electron auxiliary layer may be formed over an entire surface of the substrate 110. The hole auxiliary layer and the EML may be formed by a solution process, and the electron auxiliary layer may be formed by a deposition process.

A second electrode 192 is formed over the substrate 110 including the emitting layer 180. The second electrode 192 is positioned at an entire surface of the display area. The second electrode 192 may be a cathode and may be formed of a conductive material having a relatively low work function. For example, the second electrode 192 may be formed of aluminum (Al), magnesium (Mg), silver (Ag) or their alloy.

The first electrode 162, the emitting layer 180 and the second electrode 192 constitute the light emitting diode D.

An encapsulation film may be formed on the light emitting diode D to prevent penetration of moisture into the light emitting diode D. For example, the encapsulation film may include a first inorganic layer, an organic layer and a second inorganic layer substantially stacked, but it is not limited thereto.

The light from the emitting layer 180 is provided at a surface of the substrate 110 through the first electrode 162. Namely, the electroluminescent display device may be a bottom emission type.

Alternatively, when the electroluminescent display device of the present invention is a top-emission type, the first electrode 162 may further include a reflection electrode or a reflection layer. For example, the reflection electrode or the reflection layer may be formed of aluminum-palladium-copper (APC) alloy, and the first electrode 162 may have a triple-layered structure of ITO/APC alloy/ITO. The second electrode 192 may have a relatively small thickness for light-transmitting. For example, the second electrode 192 may have the light transmittance of about 45 to 50%.

In the electroluminescent display device of the present invention, the bank 170 may have different heights from the first electrode 162 or the substrate 110 in a major axis and a minor axis of the pixel region to overcome the thickness non-uniformity problem in the emitting layer.

Figure 4:
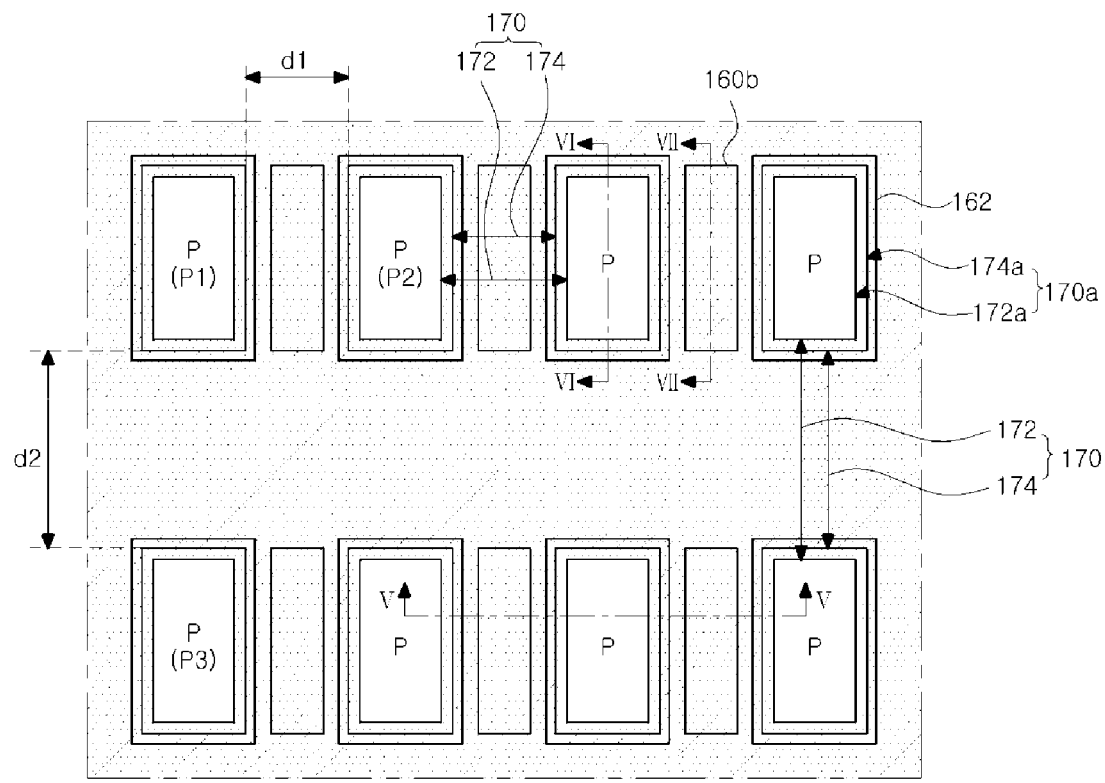
FIG. 4 is a schematic plane view of an electroluminescent display device according to a first embodiment of the present invention.
Figure 5:
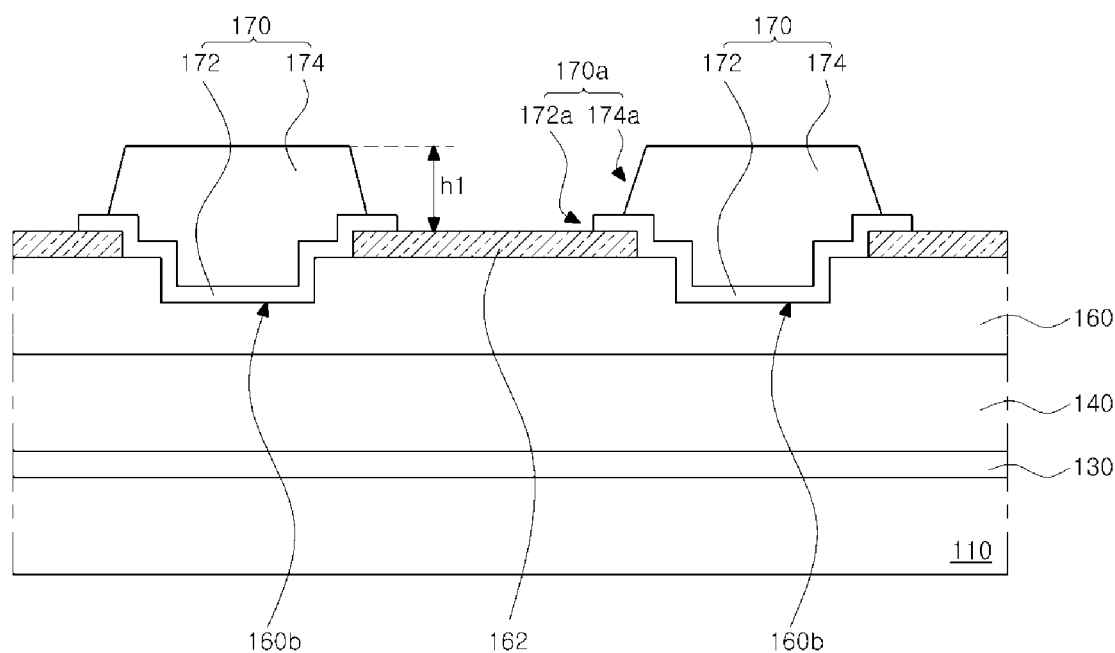
FIG. 5 is a schematic cross-sectional view taken along the line V-V of FIG. 4.
Figure 6:
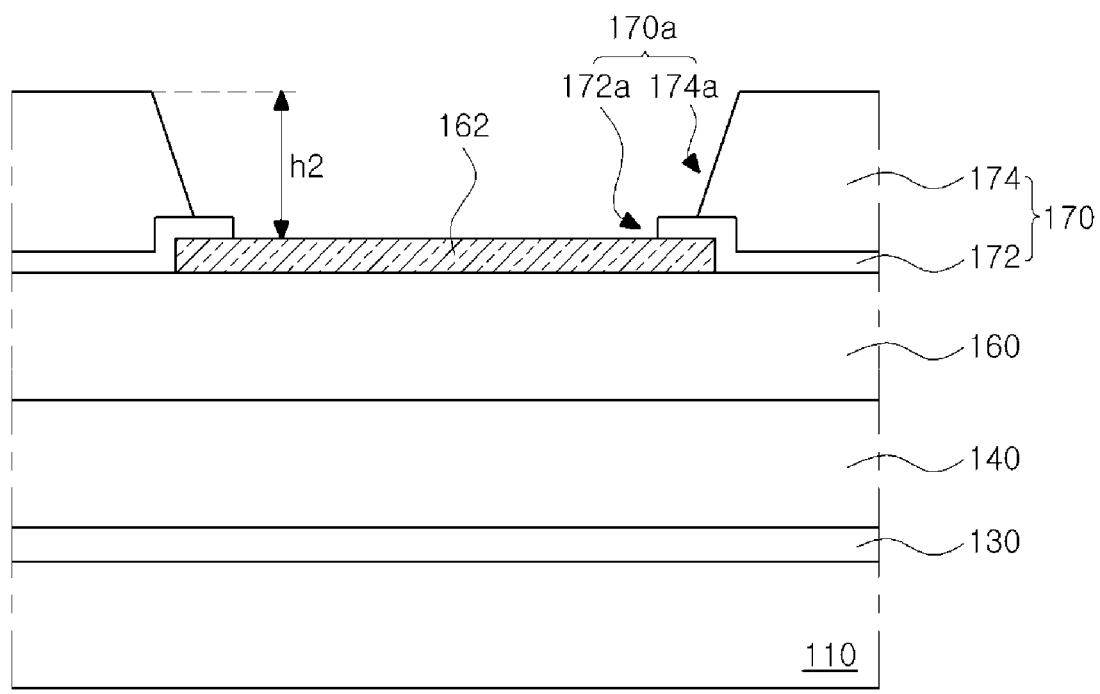
FIG. 6 is a schematic cross-sectional view taken along the line VI-VI of FIG. 4.
Figure 7:
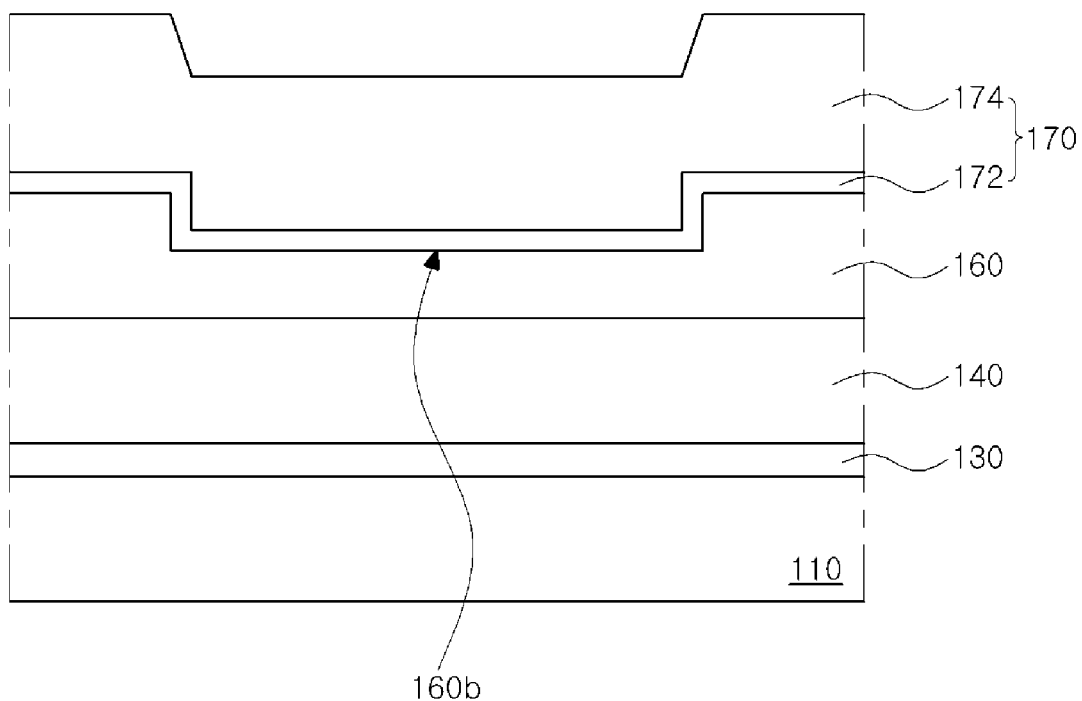
FIG. 7 is a schematic cross-sectional view taken along the line VII-VII of FIG. 4.

FIG. 4 is a schematic plane view of an electroluminescent display device according to a first embodiment of the present invention, FIG. 5 is a schematic cross-sectional view taken along the line V-V of FIG. 4. FIG. 6 is a schematic cross-sectional view taken along the line VI-VI of FIG. 4, and FIG. 7 is a schematic cross-sectional view taken along the line VII-VII of FIG. 4. For the sake of explanation, some elements are omitted.

Referring to FIGS. 4 to 7, a plurality of pixel regions P are defined on the substrate 110.

The pixel region P is an effective light-emitting area for transmitting the light, and a distance between adjacent pixel regions is different in a first direction and a second direction. Namely, the adjacent pixel regions P along the first direction has a first interval distance d1, and the adjacent pixel regions P along the second direction has a second interval distance d2 being greater than the first interval distance d1. The pixel region P may have a shape having a major axis and a minor axis, e.g., a rectangular shape. The minor axis is parallel to the first direction, and the major axis is parallel to the second direction.

Among a first pixel region P1, a second pixel region P2, which is adjacent to the first pixel region P1 along the first direction, and a third pixel region P3, which is adjacent to the first pixel region P1 along the second direction, the first and second pixel regions P1 and P2 are spaced apart from each other by the first interval distance d1, and the first and third pixel regions P1 and P3 are spaced apart from each other by the second interval distance d2.

The gate insulating layer 130, the interlayer insulating layer 140 and the passivation layer 160 are sequentially formed on or over the substrate 110.

The gate insulating layer 130 may be formed of an inorganic material, e.g., silicon oxide or silicon nitride, and the interlayer insulating layer 140 may be formed of an inorganic material, e.g., silicon oxide or silicon nitride, or an organic insulating material, e.g., benzocyclobutene or photo-acryl. The passivation layer 160 may be formed of an organic insulating material, e.g., benzocyclobutene or photo-acryl. An inorganic insulating layer formed of silicon oxide or silicon nitride may be further formed between the interlayer insulating layer 140 and the passivation layer 160.

The passivation layer 160 includes a groove 160b in a space between the pixel regions P adjacent to each other along the first direction. The groove 160b may have a rectangular shape. For example, the groove 160b may be formed in the passivation layer 160 between the first and second pixel regions P1 and P2, and the groove 160b may not be formed in the passivation layer 160 between the first and third pixel regions P1 and P3.

As explained with FIG. 3, the switching TFT, the driving TFT, the storage capacitor, gate line, data line and power line are formed under the passivation layer 160.

The first electrode 162 is formed on the passivation layer 160. The first electrode 162 in each pixel region P1 is separated from each other and contacts the drain electrode of the driving TFT through the drain contact hole of the passivation layer 160.

The bank 170 is formed on an edge of the first electrode 162. The bank 170 is positioned between adjacent pixel regions P. The bank 170 has the transmitting hole 170a exposing the first electrode 162 in each pixel region P and covers the edge of the first electrode 162. The transmitting hole 170a may have a rectangular shape.

The bank 170 includes a first bank 172 and a second bank 174 on the first bank 172. A width of the first bank 172 is greater than that of the second bank 174. The first bank 172 includes a material having a relatively high surface energy such that a contact angle of an emitting material to the first bank 172 is reduced. The second bank 174 includes a material having a relatively low surface energy such that a contact angle of an emitting material to the second bank 174 is increased such that an overflow of the emitting material into adjacent pixel region is prevented. For example, the first bank 172 may be formed of an inorganic material or an organic material each having a hydrophilic property, and the second bank 174 may be formed of an organic material having a hydrophobic property.

The first bank 172 includes a first transmitting hole 172a, and the second bank 174 includes a second transmitting hole 174a. The second transmitting hole 174a has a size being larger than the first transmitting hole 172a and overlaps the first transmitting hole 172a such that the transmitting hole 170a is defined by the first and second transmitting holes 172a and 174a. As a result, a width of the second bank 174 is smaller than that of the first bank 172 such that a portion of the first bank 172 does not covered by the second bank 174. Namely, the portion of the first bank 172 exposes and protrudes beyond the second bank 174.

Each of the first and second banks 172 and 174 may be formed by a photolithography process using a mask. Alternatively, the first and second banks 172 and 174 of the same material may be formed by a single photolithography process. In this instance, each of the first and second banks 172 and 174 may be formed of an organic material having a hydrophobic property. In addition, the bank 170 may have a single-layered structure of an organic material having a hydrophobic property.

The emitting layer is formed on the first electrode 162. Namely, the emitting layer contacts the first electrode 162 in the transmitting hole 170a. The second electrode is formed over an entire surface of the substrate 110. The emitting layer may include the hole auxiliary layer, the EML and the electron auxiliary layer sequentially stacked on the first electrode 162. For example, the hole auxiliary layer may include at least one of the HIL and the HTL, and the electron auxiliary layer may include at least one of the ETL and the EIL. A part or a total of the emitting layer may be formed by a solution process. For example, the hole auxiliary layer and the EML may be formed by the solution process.

As mentioned above, the passivation layer 160 includes the groove 160b in a space between adjacent pixel regions P along the first direction, and the bank 170 has a height difference in the first and second directions due to the groove 160b.

In more detail, the bank 170 is formed according to a step difference in the groove 160b of the passivation layer 160 such that the bank 170 between adjacent pixel regions P, e.g., the first and second pixel regions P1 and P2, along the first direction has a first height h1 from the first electrode 162, and the bank 170 between adjacent pixel regions P, e.g., the first and third pixel regions P1 and P3, along the second direction has a second height h2 from the first electrode 162. The first height h1 is smaller than the second height h2. Namely, the bank 170 has substantially the same thickness in a space between the first and second pixel regions P1 and P2 and in a space between the first and third pixel regions P1 and P3, while the bank 170 has a height difference. As shown in FIG. 5, a portion of a bottom surface of the bank 170 between the first and second pixel regions P1 and P2 is disposed lower than a bottom surface of the first electrode 162.

When the bank 170 has the same height in the first and second directions with different interval distances d1 and d2 between adjacent pixel regions along the first and second directions, the influence in one pixel region P, i.e., the first pixel region P1, from adjacent pixel regions P, i.e., the second and third pixel regions P2 and P3, along the first and second directions is different in the solution process of the emitting layer such that the emitting layer has the non-uniform thickness.

Namely, with the bank 170 having the same height in the first and second directions, in the drying process of the solution of the emitting layer, the influence of the solution in the adjacent pixel regions P along the first direction is relatively high, while the influence of the solution in the adjacent pixel regions P along the second direction is relatively low. Accordingly, there is a difference in an evaporation rate of the solvent in the solution at the first and second directions. Since the evaporation rate of the solvent in the second direction is faster than that in the first direction, the emitting layer having the uniform thickness is difficult to be provided.

In the present invention, the groove 160b is formed in the passivation layer 160 such that an upper surface of the bank 170 between adjacent pixel regions P along the first direction has a height being smaller than an upper surface of the bank 170 between adjacent pixel regions P along the second direction. Namely, the bank 170 has the first height h1 in a space between adjacent pixel regions P along the first direction and the second height h2, which is greater than the first height h1, in a space between adjacent pixel regions P along the second direction.

Namely, although the bank 170 between adjacent pixel regions P along the first direction and the bank 170 between adjacent pixel regions P along the second direction have the same thickness, a height of a bottom surface of the bank 170, i.e., a height of the upper surface of the passivation layer 160, between adjacent pixel regions P along the first direction is smaller than a height of a bottom surface of the bank 170, i.e., a height of the upper surface of the passivation layer 160, between adjacent pixel regions P along the second direction by the groove 160b. Accordingly, the first height h1 of the bank 170 in a space between adjacent pixel regions P along the first direction is smaller than the second height h2 of the bank 170 in a space between adjacent pixel regions P along the second direction.

On the other hand, the bank 170 may have a height difference in the first and second direction and has a thickness difference without the groove 160b. In this instance, there may be a problem of a thickness non-uniformity and/or a profile non-uniformity in an organic layer. In a solution process of the organic layer, a hydrophobic property of the bank is important fact to the thickness non-uniformity and/or the profile non-uniformity. However, when making the bank, which has the thickness difference, the bank has a difference of the hydrophobicity in a space between adjacent pixel regions along the first direction and along the second direction. For example, a thicker portion of the bank may have the hydrophobicity being smaller than a thinner portion of the bank. As a result, the organic layer formed in the pixel region may have a thickness non-uniformity and/or a profile non-uniformity.

However, in the present invention, since the bank 170 has a height difference in the first and second direction and has substantially the same thickness with the groove 160b, the above problem is prevented.

In a space between adjacent pixel regions P along the first direction, a contact position of the bank 170 and the passivation layer 160 is positioned at a first height from the substrate 110. In a space between adjacent pixel regions P along the second direction, a contact position of the bank 170 and the passivation layer 160 is positioned at a second height, which is greater than the first height, from the substrate 110.

In this instance, the first height h1 may be substantially equal to the height of the bank in the related art electroluminescent display device, and the second height h2 may be greater than the height of the bank in the related art electroluminescent display device. The solvent in the pixel region is efficiently trapped at the second direction and the evaporation rate of the solvent at the second direction is decreased such that the pixel region has substantially the same evaporation rates in the first and second directions. As a result, the emitting layer having improved thickness uniformity is provided.

Alternatively, the first height h1 may be smaller than the height of the bank in the related art electroluminescent display device, and the second height h2 may be substantially equal to the height of the bank in the related art electroluminescent display device. The solvent in the pixel region is less trapped at the first direction and the evaporation rate of the solvent at the first direction is increased such that the pixel region has substantially the same evaporation rates in the first and second directions. As a result, the emitting layer having improved thickness uniformity is provided.

When the HIL is formed by the solution process on the bank structure of the present invention, in one pixel region P, a maximum thickness difference (e.g., deviation) in the HIL at the first direction is about 5.3 mm, and an average thickness difference in the HIL at the first direction is about 2.45 mm. A maximum thickness difference (e.g., deviation) in the HIL at the second direction is about 12.2 mm, and an average thickness difference in the HIL at the second direction is about 5.77 mm.

On the other hand, when the HIL is formed by the solution process on the bank structure of the related art electroluminescent display device, in one pixel region P, a maximum thickness difference in the HIL at the first direction is about 8.4 mm, and an average thickness difference in the HIL at the first direction is about 3.40 mm. A maximum thickness difference (e.g., deviation) in the HIL at the second direction is about 15.7 mm, and an average thickness difference in the HIL at the second direction is about 12.7 mm.

Namely, in the electroluminescent display device according to the present invention, the thickness uniformity of the emitting layer is improved.

In FIGS. 5 and 7, a depth of the groove 160b is smaller than a thickness of the passivation layer 160, but it is not limited thereto. The depth of the groove 160b may be equal to the thickness of the passivation layer 160 such that a surface of the interlayer insulating layer 140 may be exposed through the groove 160b. In this instance, the first bank 172 may contact the interlayer insulating layer 140.

In the electroluminescent display device of the present invention, since at least a part of the emitting layer is formed by the solution process, the production cost is reduced and the electroluminescent display device of large size and/or high resolution is provided.

In addition, with the bank having a difference in the height, the evaporation rate of the solvent at the first and second direction is uniformed such that the thickness uniformity of the emitting layer and the display quality are improved.

Moreover, the emitting efficiency, the lifetime, the driving voltage and the color property of the electroluminescent display device are improved.

The shape of the groove 160b in the passivation layer 160 may be changed according to a shape of the pixel region P, i.e., an effective emitting area.

Figure 8:
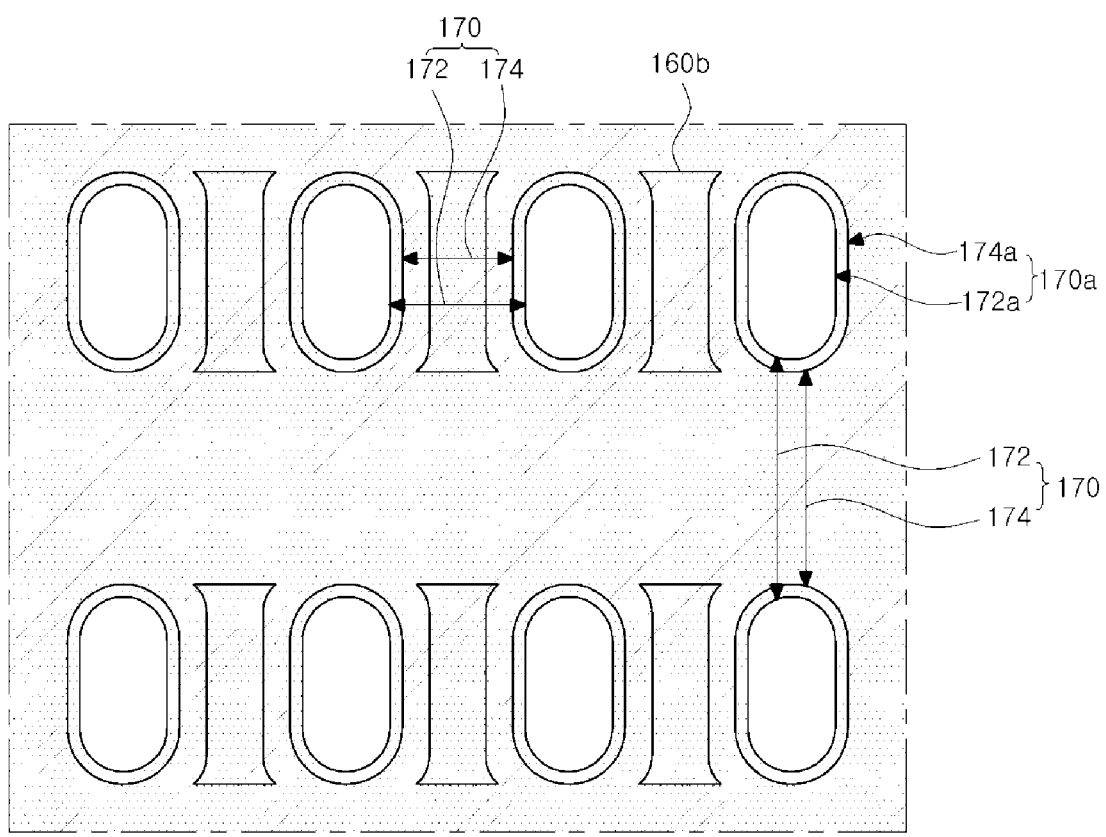
FIG. 8 is a schematic plane view of an electroluminescent display device according to a second embodiment of the present invention.

FIG. 8 is a schematic plane view of an electroluminescent display device according to a second embodiment of the present invention.

As shown in FIG. 8, a plurality of pixel regions P are defined on a substrate 110 (of FIG. 5), and each pixel region P may have a narrow circle shape in a plane view. The pixel region P includes a minor axis along the first direction and a major axis along the second direction. Namely, the pixel region P includes semicircle-shaped ends and a linear center portion connecting the semicircle-shaped ends.

The bank 170 includes a transmitting hole 170a corresponding to the shape of the pixel region P. Namely, the transmitting hole 170a also has a narrow circle shape in a plane view.

The bank 170 includes a first bank 172 and a second bank 174 on the first bank 172. The first bank 172 includes a first transmitting hole 172a, and the second bank 174 includes a second transmitting hole 174a. The second transmitting hole 174a has a size being larger than the first transmitting hole 172a and overlaps the first transmitting hole 172a such that the transmitting hole 170a is defined by the first and second transmitting holes 172a and 174a. As a result, a width of the second bank 174 is less than that of the first bank 172 such that a portion of the first bank 172 does not covered by the second bank 174. Namely, the portion of the first bank 172 exposes and protrudes beyond the second bank 174.

The groove 160b is formed in the passivation layer 160 between adjacent pixel regions P along the first direction. A side surface of the groove 160b facing the transmitting hole 170a has substantially the same shape as a side surface of the transmitting hole 170a. As a result, the side surfaces of the groove 160b and the transmitting hole 170a have a constant distance. On the other hand, the groove 160b includes a protrusion at a corner (four corners) toward a corner of the transmitting hole 170a. Accordingly, the groove 160b and the transmitting hole 170a have a constant distance at the corner as well as the side surface.

In the embodiment(s) of the present invention, a shape of the groove 160b is changed according to a shape of the pixel region P, i.e., a shape of the transmitting hole 170a, to have a constant distance between the pixel region P and the groove 160b. As a result, the emitting layer having the thickness uniformity is provided.

Figure 9:
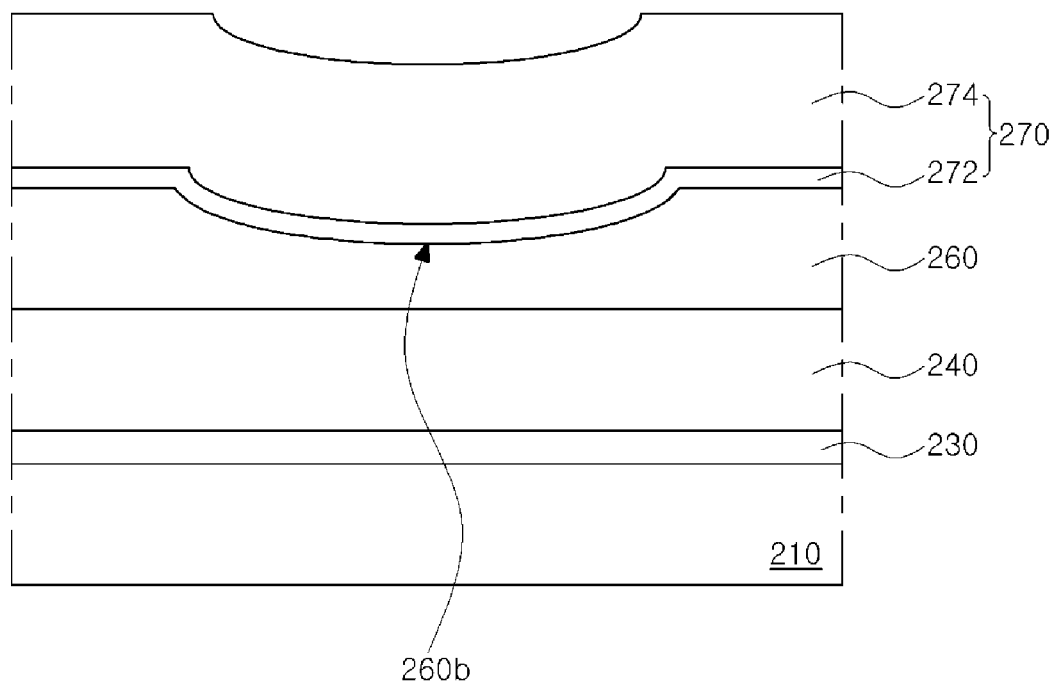
FIG. 9 is a schematic cross-sectional view of an electroluminescent display device according to a third embodiment of the present invention.

FIG. 9 is a cross-sectional view of an electroluminescent display device according to a third embodiment of the present invention. FIG. 9 shows a cross-sectional view taken along the line VII-VII of FIG. 4.

As shown in FIG. 9, the gate insulating layer 230, the interlayer insulating layer 240 and the passivation layer 260 are sequentially formed on or over the substrate 210, and the bank 270 including the first and second banks 272 and 274 is formed on the passivation layer 260.

The passivation layer 260 includes a groove 260b in a space between the pixel regions P (of FIG. 4) adjacent to each other along the first direction. A height in a portion of the bank 270 in the groove 260b is reduced.

In the groove 260b, a center depth is greater than an edge depth in the second direction. The depth of the groove 260b may be gradually decreased from the center to the edge along the second direction. Namely, an upper surface of the passivation layer 260 corresponding to the groove 260b may have a convex shape toward the substrate 210.

For example, the groove 260b may be formed by a photolithography process using a mask having a light transmitting gradual difference from a center to an edge.

Figure 10:
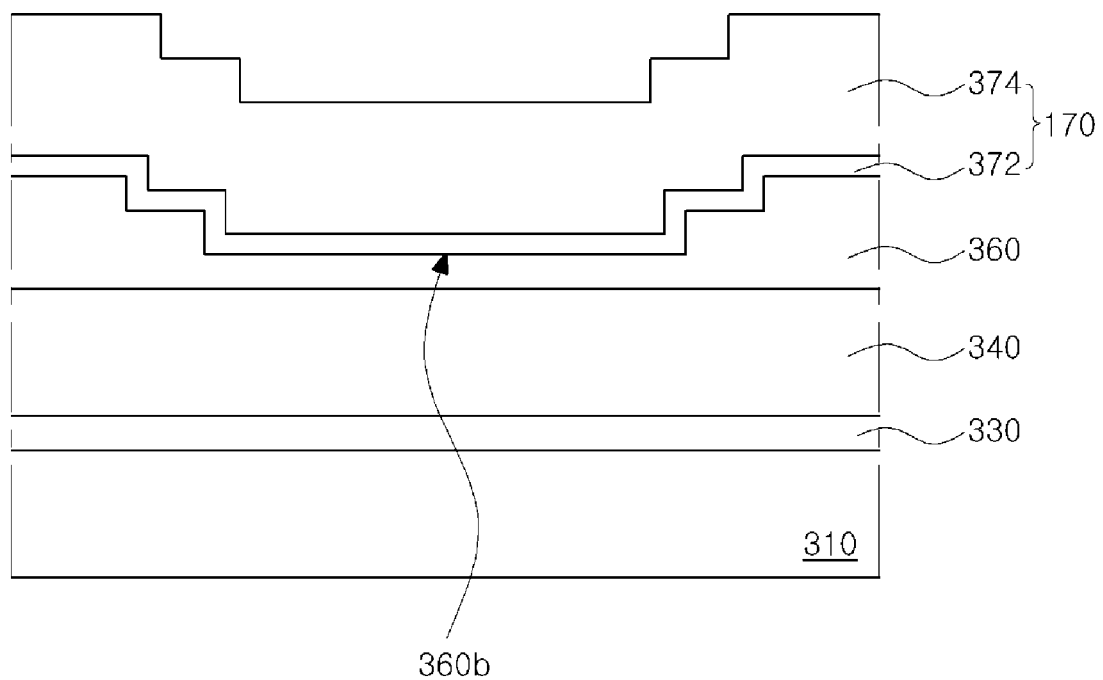
FIG. 10 is a schematic cross-sectional view of an electroluminescent display device according to a fourth embodiment of the present invention.

FIG. 10 is a schematic cross-sectional view of an electroluminescent display device according to a fourth embodiment of the present invention. FIG. 10 shows a cross-sectional view taken along the line VII-VII of FIG. 4.

As shown in FIG. 10, the gate insulating layer 330, the interlayer insulating layer 340 and the passivation layer 360 are sequentially formed on or over the substrate 310, and the bank 370 including the first and second banks 372 and 374 is formed on the passivation layer 360.

The passivation layer 360 includes a groove 360b in a space between the pixel regions P (of FIG. 4) adjacent to each other along the first direction. A height in a portion of the bank 370 in the groove 360b is reduced.

In the groove 360b, a center depth is greater than an edge depth in the second direction. The groove 360b may have a first depth in the center and a second depth, which is smaller than the first depth, in both edges along the second direction. Namely, the groove 360b may have a dual step difference structure, e.g., a stair shape.

For example, the groove 360b may be formed by a photolithography process using two masks having a light transmitting difference or a half-ton mask.

Due to the shape of the groove 360b, the thickness difference of a W-shaped emitting layer may be efficiently uniformed.

Figure 11:
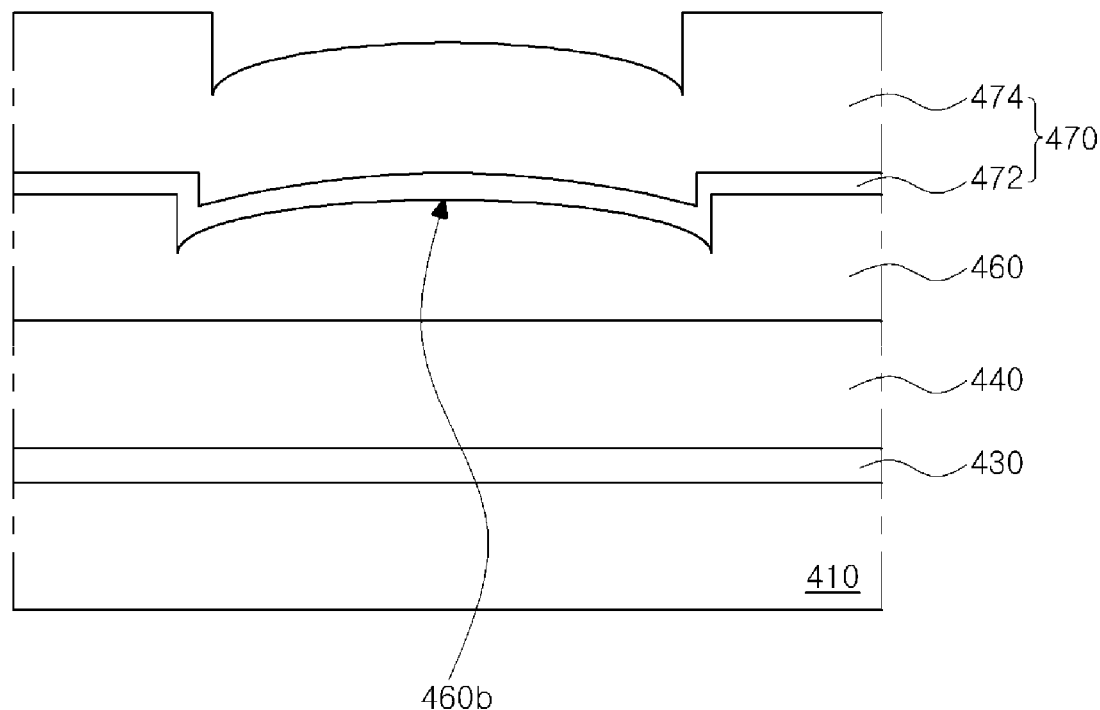
FIG. 11 is a schematic cross-sectional view of an electroluminescent display device according to a fifth embodiment of the present invention.

FIG. 11 is a schematic cross-sectional view of an electroluminescent display device according to a fifth embodiment of the present invention. FIG. 11 shows a cross-sectional view taken along the line VII-VII of FIG. 4.

As shown in FIG. 11, the gate insulating layer 430, the interlayer insulating layer 440 and the passivation layer 460 are sequentially formed on or over the substrate 410, and the bank 470 including the first and second banks 472 and 474 is formed on the passivation layer 460.

The passivation layer 460 includes a groove 460b in a space between the pixel regions P (of FIG. 4) adjacent to each other along the first direction. A height in a portion of the bank 470 in the groove 460b is reduced.

In the groove 460b, a center depth is smaller than an edge depth in the second direction. The depth of the groove 460b may be gradually decreased from the edge to the center along the second direction. Namely, an upper surface of the passivation layer 460 corresponding to the groove 460b may have a convex shape toward the bank 470.

In this instance, a height of the bank 470 in an edge of the groove 460b, which faces the transmitting hole 470a, is efficiently reduced such that an evaporation rate of the solvent in the emitting material solution is efficiently increased. As a result, the thickness uniformity of the emitting layer is improved.

For example, the groove 460b may be formed by a photolithography process using a mask having a light transmitting gradual difference from a center to an edge.

Figure 12:
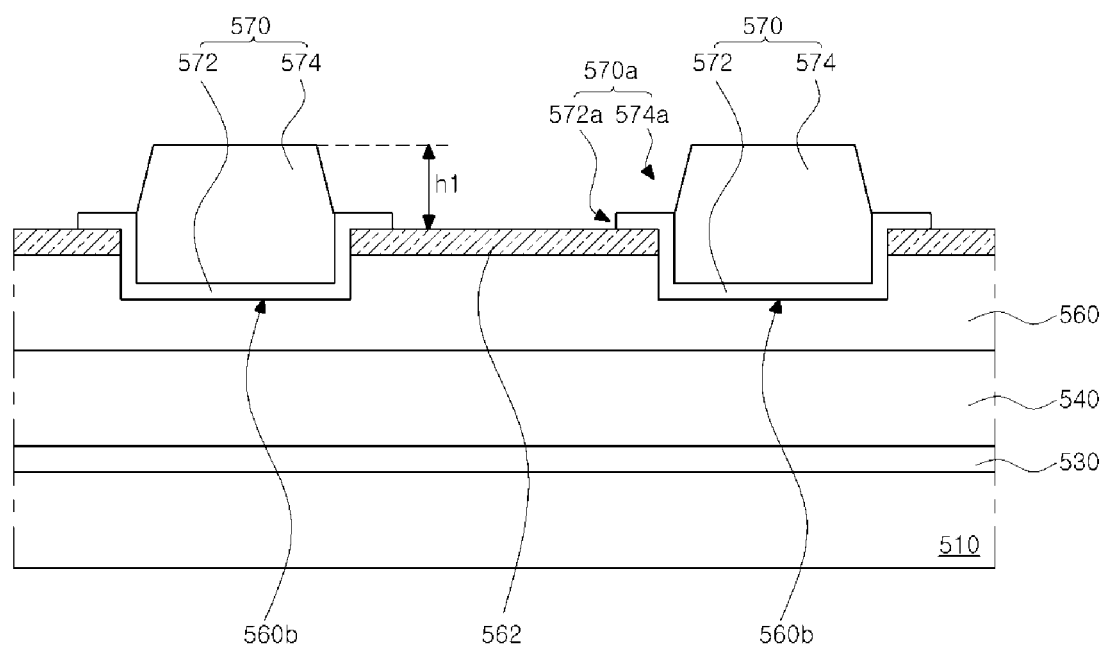
FIG. 12 is a schematic cross-sectional view of an electroluminescent display device according to a sixth embodiment of the present invention.

FIG. 12 is a schematic cross-sectional view of an electroluminescent display device according to a sixth embodiment of the present invention. FIG. 12 shows a cross-sectional view taken along the line V-V of FIG. 4.

As shown in FIG. 12, the gate insulating layer 530, the interlayer insulating layer 540 and the passivation layer 560 are sequentially formed on or over the substrate 510, and the bank 570 including the first and second banks 572 and 574 is formed on the passivation layer 560.

The passivation layer 560 includes a groove 560b in a space between the pixel regions P (of FIG. 4) adjacent to each other along the first direction. A width of the groove 560b is substantially equal to a distance between adjacent first electrodes 562. A height in a portion of the bank 570 in the groove 560b is reduced.

The groove 560b has a rectangular cross-section. Alternatively, the groove 560b may have a round cross-section similar to a shape of the groove 260b (of FIG. 9) or a shape of the groove 460b (of FIG. 11).

In the present invention, a height of the bank 570 between adjacent pixel regions along the first direction is smaller than that of the bank 570 between adjacent pixel regions along the second direction. Accordingly, even though a distance between adjacent pixel regions is different along the first and second directions, an evaporation rate of the solvent in the emitting material solution is uniformed such that the emitting layer having the thickness uniformity is provided.

Figure 13A:
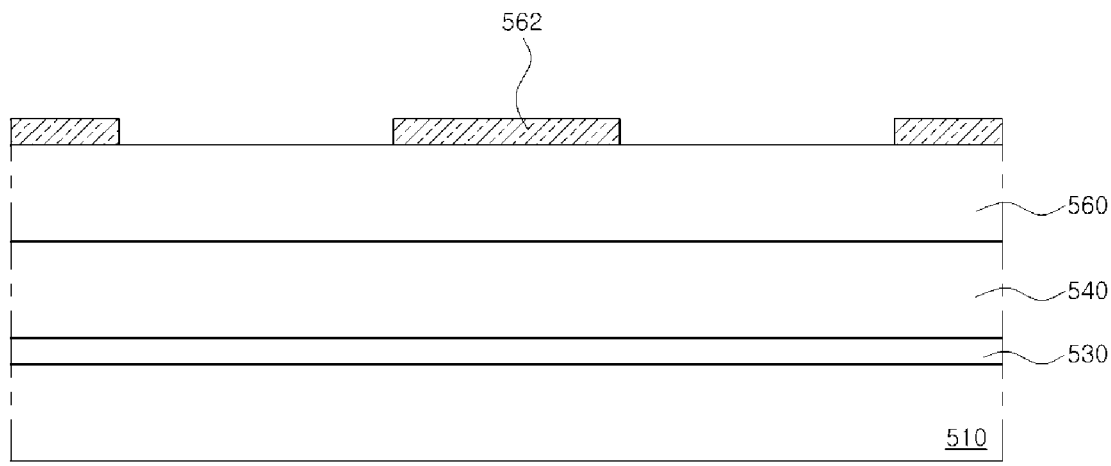
FIGS. 13A to 13C are schematic cross-sectional view illustrating a fabricating process of a portion of an electroluminescent display device according to the sixth embodiment of the present invention.
Figure 13B:
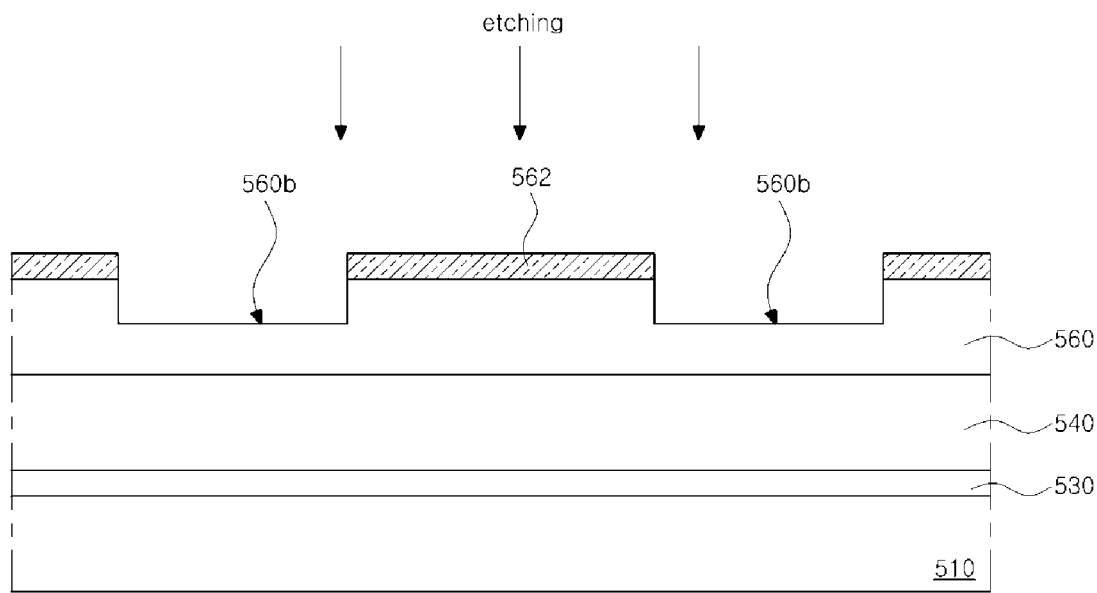
Figure 13C:
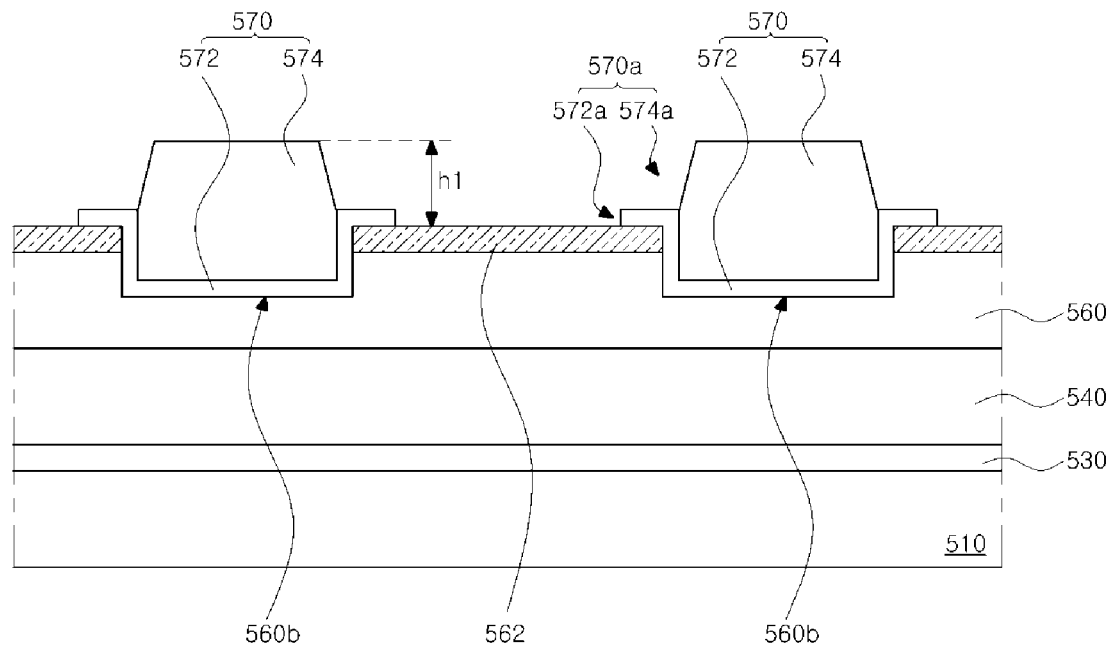

FIGS. 13A to 13C are schematic cross-sectional view illustrating a fabricating process of a portion of an electroluminescent display device according to the sixth embodiment of the present invention.

As shown in FIG. 13A, the gate insulating layer 530, the interlayer insulating layer 540 and the passivation layer 560 are formed on the substrate 510. A conductive material layer is formed on the passivation layer 560. The conductive material layer may include a transparent conductive material such as indium-tin-oxide (ITO) or indium-zinc-oxide (IZO). The conductive material layer is patterned to form the first electrode 562 in each pixel region.

Referring to FIG. 3, the semiconductor layer 122 is formed on the substrate 510 before forming the gate insulating layer 530, and the gate electrode 132 is formed on the gate insulating layer 530 before forming the interlayer insulating layer 540. In addition, the source electrode 152 and the drain electrode 154 are formed on the interlayer insulating layer 540 before forming the passivation layer 560.

Next, as shown in FIG. 13B, a portion of the passivation layer 560 is patterned by an etching process using the first electrode 562 as an etching mask to form the groove 560b. The etching process may be an anisotropic dry etching process. As a result, an end of the groove 560b may exactly match with or correspond to an end of the first electrode 562. Namely, a width of the groove 560b is substantially equal to a distance between adjacent first electrodes 562.

Alternatively, the passivation layer 560 may be patterned to form the groove 560b before forming the first electrode 562. In this instance, the groove 560b and the drain contact hole 160a (of FIG. 3) may be formed by a single mask process.

In this instance, by a mis-alignment of the first electrode 562 and the groove 560b, an end of the first electrode 562 may be positioned in the groove 560b such that a height of the bank 570 in the groove 560b may be increased.

However, when the groove 560b is patterned using the first electrode 562 as an etching mask, the first electrode 562 is not positioned in the groove 560b. Accordingly, the above problem is prevented.

Next, as shown in FIG. 13C, an insulating material layer is formed on the first electrode 562 and the passivation layer 560. The insulating material layer is patterned to form the bank 570. The emitting layer 180 (of FIG. 3) and the second electrode 192 are formed on the first electrode 562 and optionally on the bank 570.

Figure 14:
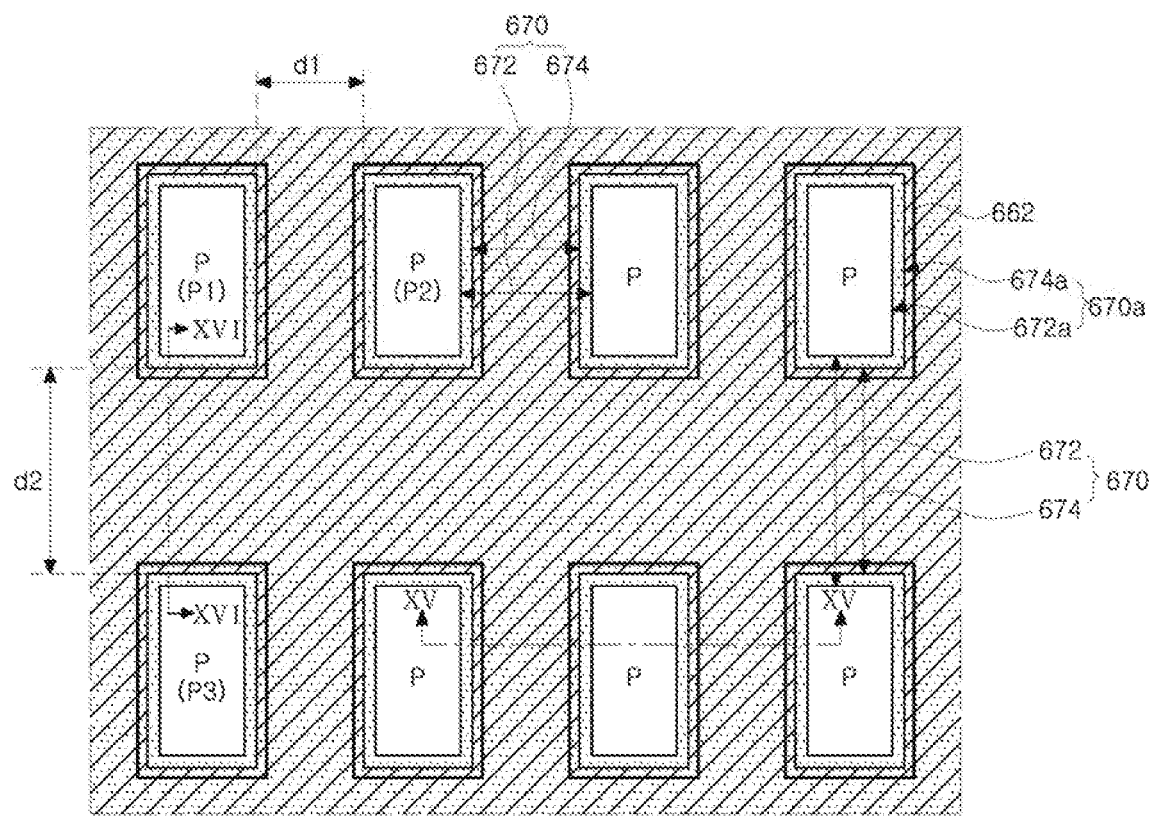
FIG. 14 is a schematic plane view of an electroluminescent display device according to a seventh embodiment of the present invention.
Figure 15:
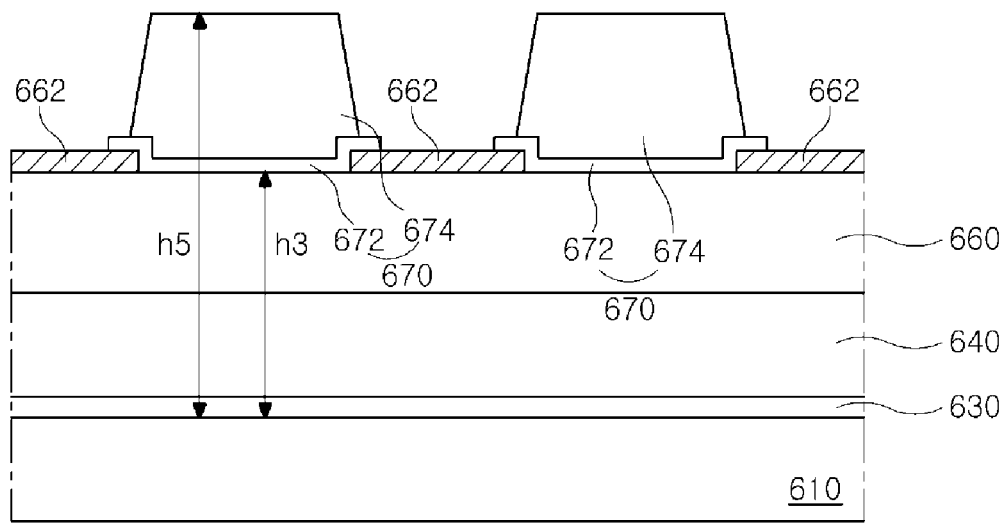
FIG. 15 is a schematic cross-sectional view taken along the line XV-XV of FIG. 14.

FIG. 14 is a schematic plane view of an electroluminescent display device according to a seventh embodiment of the present invention. FIG. 15 is a schematic cross-sectional view taken along the line XV-XV of FIG. 14, and FIG. 16 is a schematic cross-sectional view taken along the line XVI-XVI of FIG. 14.

Figure 16:
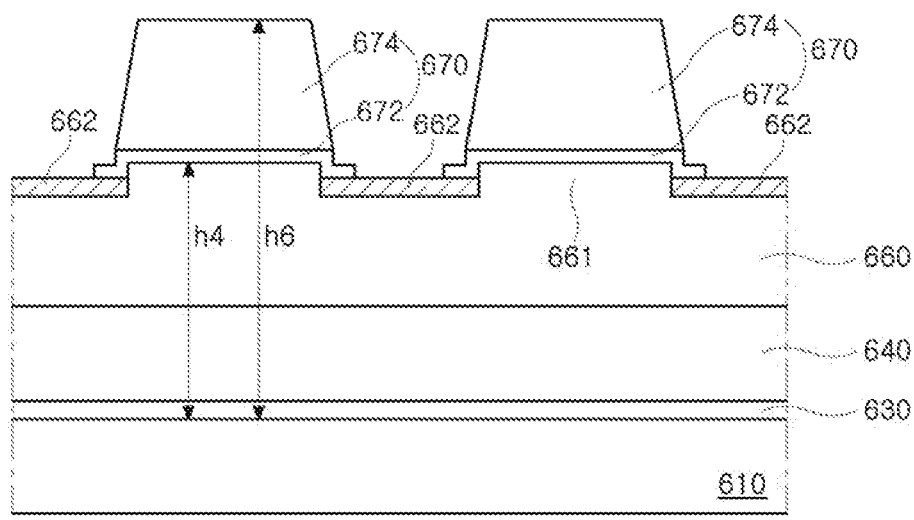
FIG. 16 is a schematic cross-sectional view taken along the line XVI-XVI of FIG. 14.

Referring to FIGS. 14 to 16, a plurality of pixel regions P are defined on the substrate 610.

The pixel region P is an effective light-emitting area for transmitting the light, and a distance between adjacent pixel regions is different in a first direction and a second direction. Namely, the adjacent pixel regions P along the first direction has a first interval distance d1, and the adjacent pixel regions P along the second direction has a second interval distance d2 being greater than the first interval distance d1. The pixel region P may have a shape having a major axis and a minor axis, e.g., a rectangular shape. The minor axis is parallel to the first direction, and the major axis is parallel to the second direction.

Among a first pixel region P1, a second pixel region P2, which is adjacent to the first pixel region P1 along the first direction, and a third pixel region P3, which is adjacent to the first pixel region P1 along the second direction, the first and second pixel regions P1 and P2 are spaced apart from each other by the first interval distance d1, and the first and third pixel regions P1 and P3 are spaced apart from each other by the second interval distance d2.

The gate insulating layer 630, the interlayer insulating layer 640 and the passivation layer 660 are sequentially formed on or over the substrate 610.

The gate insulating layer 630 may be formed of an inorganic material, e.g., silicon oxide or silicon nitride, and the interlayer insulating layer 640 may be formed of an inorganic material, e.g., silicon oxide or silicon nitride, or an organic insulating material, e.g., benzocyclobutene or photo-acryl. The passivation layer 660 may be formed of an organic insulating material, e.g., benzocyclobutene or photo-acryl. An inorganic insulating layer formed of silicon oxide or silicon nitride may be further formed between the interlayer insulating layer 140 and the passivation layer 660.

The passivation layer 660 includes a protruding portion 661 in a space between the pixel regions P adjacent to each other along the second direction. Namely, the protruding portion 661 of the passivation layer 660 is positioned between the first and third pixel regions P1 and P3. As a result, an upper surface of the passivation layer 660 between the first and second pixel regions P1 and P2 adjacent along the first direction has a third height h3 from the substrate 610, and an upper surface of the passivation layer 660, i.e., the protruding portion 661, between the first and third pixel regions P1 and P3 adjacent along the second direction has a fourth height h4, which is greater than the third height h3, from the substrate 610. The protruding portion 661 is formed on the passivation layer 660 between the first and third pixel regions P1 and P3, while there is no protruding portion 661 on the passivation layer 660 between the first and second pixel regions P1 and P2 such that the passivation layer 660 between the first and second pixel regions P1 and P2 provides a flat top surface.

As explained with FIG. 3, the switching TFT, the driving TFT, the storage capacitor, gate line, data line and power line are formed under the passivation layer 660.

The first electrode 662 is formed on the passivation layer 660. The first electrode 662 in each pixel region P1 is separated from each other and contacts the drain electrode of the driving TFT through the drain contact hole of the passivation layer 660.

The bank 670 is formed on an edge of the first electrode 662. The bank 670 is positioned between adjacent pixel regions P. The bank 670 has the transmitting hole 670a exposing the first electrode 662 in each pixel region P and covers the edge of the first electrode 662. The transmitting hole 670a may have a rectangular shape.

The bank 670 includes a first bank 672 and a second bank 674 on the first bank 672. A width of the first bank 672 is greater than that of the second bank 674. The first bank 672 includes a material having a relatively high surface energy such that a contact angle of an emitting material to the first bank 672 is reduced. The second bank 674 includes a material having a relatively low surface energy such that a contact angle of an emitting material to the second bank 674 is increased such that an overflow of the emitting material into adjacent pixel region is prevented. For example, the first bank 672 may be formed of an inorganic material or an organic material each having a hydrophilic property, and the second bank 674 may be formed of an organic material having a hydrophobic property.

The first bank 672 includes a first transmitting hole 672a, and the second bank 674 includes a second transmitting hole 674a. The second transmitting hole 674a has a size being larger than the first transmitting hole 672a and overlaps the first transmitting hole 672a such that the transmitting hole 670a is defined by the first and second transmitting holes 672a and 674a. As a result, a width of the second bank 674 is smaller than that of the first bank 672 such that a portion of the first bank 672 does not covered by the second bank 674. Namely, the portion of the first bank 672 exposes and protrudes beyond the second bank 674.

Each of the first and second banks 672 and 674 may be formed by a photolithography process using a mask. Alternatively, the first and second banks 672 and 674 of the same material may be formed by a single photolithography process. In this instance, each of the first and second banks 672 and 674 may be formed of an organic material having a hydrophobic property. In addition, the bank 670 may have a single-layered structure of an organic material having a hydrophobic property.

The emitting layer is formed on the first electrode 662. Namely, the emitting layer contacts the first electrode 662 in the transmitting hole 670a. The second electrode is formed over an entire surface of the substrate 610. The emitting layer may include the hole auxiliary layer, the EML and the electron auxiliary layer sequentially stacked on the first electrode 662. For example, the hole auxiliary layer may include at least one of the HIL and the HTL, and the electron auxiliary layer may include at least one of the ETL and the EIL. A part or a total of the emitting layer may be formed by a solution process. For example, the hole auxiliary layer and the EML may be formed by the solution process.

As mentioned above, the passivation layer 660 includes the protruding portion 661 in a space between adjacent pixel regions P along the second direction, and the bank 670 has a height difference in the first and second directions due to the protruding portion 661.

In more detail, the bank 670 is formed according to a step difference in the protruding portion 661 of the passivation layer 660 such that the bank 670 between adjacent pixel regions P, e.g., the first and second pixel regions P1 and P2, along the first direction has a fifth height h5 from the substrate 610, and the bank 670 between adjacent pixel regions P, e.g., the first and third pixel regions P1 and P3, along the second direction has a sixth height h6 from the substrate 610. The fifth height h5 is smaller than the sixth height h6. Namely, the bank 670 has substantially the same thickness in a space between the first and second pixel regions P1 and P2 and in a space between the first and third pixel regions P1 and P3, while the bank 670 has a height difference.

When the bank 670 has the same height in the first and second directions with different interval distances d1 and d2 between adjacent pixel regions along the first and second directions, the influence in one pixel region P, i.e., the first pixel region P1, from adjacent pixel regions P, i.e., the second and third pixel regions P2 and P3, along the first and second directions is different in the solution process of the emitting layer such that the emitting layer has the non-uniform thickness.

Namely, with the bank 670 having the same height in the first and second directions, in the drying process of the solution of the emitting layer, the influence of the solution in the adjacent pixel regions P along the first direction is relatively high, while the influence of the solution in the adjacent pixel regions P along the second direction is relatively low. Accordingly, there is a difference in an evaporation rate of the solvent in the solution at the first and second directions. Since the evaporation rate of the solvent in the second direction is faster than that in the first direction, the emitting layer having the uniform thickness is difficult to be provided.

In the present invention, the protruding portion 661 is formed in the passivation layer 660 such that an upper surface of the bank 670 between adjacent pixel regions P along the first direction has a height being smaller than an upper surface of the bank 670 between adjacent pixel regions P along the second direction. Namely, the bank 670 has the fifth height h5 in a space between adjacent pixel regions P along the first direction and the sixth height h6, which is greater than the fifth height h5, in a space between adjacent pixel regions P along the second direction.

Namely, although the bank 670 between adjacent pixel regions P along the first direction and the bank 670 between adjacent pixel regions P along the second direction have the same thickness, a third height h3 of a bottom surface of the bank 670, i.e., a height of the upper surface of the passivation layer 660, between adjacent pixel regions P along the first direction is smaller than a fourth height h4 of a bottom surface of the bank 670, i.e., a height of the upper surface of the passivation layer 660, between adjacent pixel regions P along the second direction by the protruding portion 661. Accordingly, the fifth height h5 of the bank 670 in a space between adjacent pixel regions P along the first direction is smaller than the sixth height h6 of the bank 670 in a space between adjacent pixel regions P along the second direction.

In the electroluminescent display device of the present invention, since at least a part of the emitting layer is formed by the solution process, the production cost is reduced and the electroluminescent display device of large size and/or high resolution is provided.

In addition, with the bank having a difference in the height, the evaporation rate of the solvent at the first and second direction is uniformed such that the thickness uniformity of the emitting layer and the display quality are improved.

Moreover, the emitting efficiency, the lifetime, the driving voltage and the color property of the electroluminescent display device are improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electroluminescent display device, comprising:
   a substrate including first, second and third pixel regions, the second and third pixel regions being adjacent to the first pixel region along a first direction and a second direction substantially perpendicular to the first direction, respectively;
   an insulating layer over the substrate and including a groove between the first and second pixel regions;
   a first electrode on the insulating layer and in each of the first to third pixel regions, the first electrode including a first edge along a major axis of each of the first, second and third pixel regions and a second edge along a minor axis of each of the first, second and third pixel regions;
   a bank covering the first and second edges of the first electrode and disposed between the first pixel region and the second pixel region and between the first pixel region and the third pixel region;
   an emitting layer on the first electrode; and
   a second electrode on the emitting layer,
   wherein the bank has a double-layered structure of a first bank and a second bank on the first bank and is disposed between the first and second pixels regions along the first direction and between the first and third pixel regions along the second direction,
   wherein a major side surface of the second bank disposed along the major axis of the first pixel region has a first height extending from an uppermost surface of the first bank on the first edge of the first electrode to an uppermost surface of the second bank in an area adjacent a long side of the first pixel region,
   wherein a minor side surface of the second bank disposed along the minor axis of the first pixel region has a second height extending from an uppermost surface of the first bank on the second edge of the first electrode to an uppermost surface of the second bank in an area adjacent a short side of the first pixel region, the second height being greater than the first height, and
   wherein a portion of a bottom surface of the first bank along the major axis of the first pixel region is disposed inside the groove such that the portion of the bottom surface of the first bank is positioned to be lower than a bottom surface of the first electrode.

2. The electroluminescent display device according to claim 1, wherein the groove of the insulating layer is completely filled by the bank.

3. The electroluminescent display device according to claim 1, wherein the groove has a depth smaller than a thickness of the insulating layer.

4. The electroluminescent display device according to claim 1, wherein a first interval distance between the first and second pixel regions is smaller than a second interval distance between the first and third pixel regions.

5. The electroluminescent display device according to claim 1, wherein each of the first to third pixel regions has a major axis and a minor axis, and the minor axis and the major axis are respectively parallel to the first and second directions.

6. The electroluminescent display device according to claim 1, wherein each of the first to third pixel regions has an oval planar shape, and the groove includes a center portion and a protrusion portion at a corner of the center portion.

7. The electroluminescent display device according to claim 1, wherein the groove has a center depth being greater than an edge depth along the second direction.

8. The electroluminescent display device according to claim 1, wherein the groove has a center depth being smaller than an edge depth along the second direction.

9. The electroluminescent display device according to claim 1, wherein the bank has substantially a same thickness in a space between the first and second pixel regions and in a space between the first and third pixel regions.

10. The electroluminescent display device according to claim 1, wherein an end of the groove corresponds to an end of the first electrode.

11. The electroluminescent display device according to claim 10, wherein a width of the groove is equal to a distance between the first electrodes in the first and second pixel regions.

12. An electroluminescent display device, comprising:
    a substrate including first, second and third pixel regions, the second and third pixel regions being adjacent to the first pixel region along a first direction and a second direction substantially perpendicular to the first direction, respectively;
    an insulating layer over the substrate and including a groove between the first and second pixel regions and a protruding portion between the first and third pixel regions;
    a first electrode on the insulating layer and in each of the first to third pixel regions, the first electrode including a first edge along a major axis of each of the first, second and third pixel regions and a second edge along a minor axis of each of the first, second and third pixel regions;
    a bank covering the first and second edges of the first electrode and disposed between the first pixel region and the second pixel region and between the first pixel region and the third pixel region;
an emitting layer on the first electrode; and
a second electrode on the emitting layer,
wherein the bank has a double-layered structure of a first bank and a second bank on the first bank and is disposed between the first and second pixels regions along the first direction and between the first and third pixel regions along the second direction,
wherein a first thickness of the second bank disposed along the major axis of the first pixel region is thinner than a second thickness of the second bank disposed along the minor axis of the first pixel region,
wherein the first thickness extends from an uppermost surface of the first bank on the first edge of the first electrode to an uppermost surface of the second bank in a first area adjacent to a long side of the first pixel region, and the second thickness extends from an uppermost surface of the first bank on the second edge of the first electrode to an uppermost surface of the second bank in a second area adjacent to a short side of the first pixel region,
wherein a first portion of a bottom surface of the first bank along the major axis of the first pixel region is disposed inside the groove such that the first portion of the bottom surface of the first bank is positioned to be lower than a bottom surface of the first electrode, and
wherein a second portion of a bottom surface of the first bank along the minor axis of the first pixel region is disposed on the protruding portion such that the second portion of the bottom surface of the first bank is positioned at a same height as the bottom surface of the first electrode.

13. The electroluminescent display device according to claim 12, wherein the groove of the insulating layer is completely filled by the bank.

14. The electroluminescent display device according to claim 12, wherein the groove has a depth smaller than a thickness of the insulating layer.

15. The electroluminescent display device according to claim 12, wherein a first interval distance between the first and second pixel regions is smaller than a second interval distance between the first and third pixel regions.

16. The electroluminescent display device according to claim 12, wherein each of the first to third pixel regions has a major axis and a minor axis, and the minor axis and the major axis are respectively parallel to the first and second directions.

17. The electroluminescent display device according to claim 12, wherein each of the first to third pixel regions has an oval planar shape, and the groove includes a center portion and a protrusion portion at a corner of the center portion.

18. The electroluminescent display device according to claim 12, wherein the groove has a center depth being greater than an edge depth along the second direction.

19. The electroluminescent display device according to claim 12, wherein the groove has a center depth being smaller than an edge depth along the second direction.

20. The electroluminescent display device according to claim 12, wherein the bank has substantially a same thickness in a space between the first and second pixel regions and in a space between the first and third pixel regions.

21. The electroluminescent display device according to claim 12, wherein an end of the groove corresponds to an end of the first electrode.

22. The electroluminescent display device according to claim 21, wherein a width of the groove is equal to a distance between the first electrodes in the first and second pixel regions.

23. The electroluminescent display device according to claim 1, wherein the first bank includes a material having a high surface energy such that a contact angle of emitting material of the emitting layer to the first bank is reduced, and
wherein the second bank includes a material having a low surface energy such that a contact angle of the emitting material to the second bank is increased and an overflow of the emitting material into an adjacent pixel region is prevented.

24. The electroluminescent display device according to claim 12, wherein the first bank includes a material having a high surface energy such that a contact angle of emitting material of the emitting layer to the first bank is reduced, and
wherein the second bank includes a material having a low surface energy such that a contact angle of the emitting material to the second bank is increased and an overflow of the emitting material into an adjacent pixel region is prevented.

* * * * *